(12) United States Patent
Foster

(10) Patent No.: US 6,368,963 B1
(45) Date of Patent: Apr. 9, 2002

(54) PASSIVATION OF SEMICONDUCTOR DEVICE SURFACES USING AN IODINE/ETHANOL SOLUTION

(75) Inventor: John C. Foster, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/660,396

(22) Filed: Sep. 12, 2000

(51) Int. Cl.[7] .................... H01L 21/44; H01L 21/336; H01L 21/4763

(52) U.S. Cl. ................ 438/655; 438/299; 438/300; 438/630; 438/649; 438/651; 438/682; 438/660

(58) Field of Search ................ 438/299, 300, 438/364, 581, 583, 642, 643, 647, 648, 649, 650, 651, 652, 655, 660, 664, 682, 663, 66.1, 630

(56) References Cited

U.S. PATENT DOCUMENTS

| 4,514,253 A | * | 4/1985 | Minezaki .............. 156/659.1 |
| 4,735,680 A | * | 4/1988 | Yen ..................... 156/643 |
| 5,580,828 A | | 12/1996 | Ferenczi et al. ........... 432/255 |
| 6,051,863 A | * | 4/2000 | Hause et al. .............. 257/369 |
| 6,153,484 A | * | 11/2000 | Donaton et al. ........... 438/301 |
| 6,218,249 B1 | * | 4/2001 | Maa et al. ............... 438/300 |
| 6,228,728 B1 | * | 5/2001 | Furukawa et al. ......... 438/300 |
| 6,265,753 B1 | * | 7/2001 | Carter et al. ............. 257/508 |

FOREIGN PATENT DOCUMENTS

JP          10294459     * 11/1998

* cited by examiner

Primary Examiner—Charles Bowers
Assistant Examiner—Thanhha Pham

(57) ABSTRACT

Shorting between a transistor gate electrode and associated source/drain regions due to metal silicide formation on the sidewall spacers is prevented by passivating the sidewall spacer surfaces with a solution of iodine and ethanol. Embodiments of the invention include spraying the wafer with or immersing the wafer in, a solution of iodine in ethanol.

13 Claims, 3 Drawing Sheets

PASSIVATION OF SEMICONDUCTOR DEVICE SURFACES USING AN IODINE/ETHANOL SOLUTION

RELATED APPLICATIONS

This application contains subject matter similar to that disclosed in U.S. patent application Ser. No. 09/664,714, filed on Sep. 19, 2000.

TECHNICAL FIELD

The present invention relates to the field of manufacturing semiconductor devices and, more particularly, to an improved salicide process of forming metal silicide contacts.

BACKGROUND OF THE INVENTION

An important aim of ongoing research in the semiconductor industry is the reduction in the dimensions of the devices used in integrated circuits. Planar transistors, such as metal oxide semiconductor (MOS) transistors, are particularly suited for use in high-density integrated circuits. As the size of the MOS transistors and other active devices decreases, the dimensions of the source/drain regions and gate electrodes, and the channel region of each device, decrease correspondingly.

The design of ever-smaller planar transistors with short channel lengths makes it necessary to provide very shallow source/drain junctions. Shallow junctions are necessary to avoid lateral diffusion of implanted dopants into the channel, since such a diffusion disadvantageously contributes to leakage currents and poor breakdown performance. Shallow source/drain junctions of less than 1,000 Å, e.g., less than 800 Å, are required for acceptable performance in short channel devices.

Metal silicide contacts are typically used to provide low resistance contacts to source/drain regions and gate electrodes. The metal silicide contacts are conventionally formed by depositing a conductive metal, such as titanium, cobalt, tungsten, or nickel, on the source/drain regions and gate electrodes by physical vapor deposition (PVD), e.g. sputtering or evaporation; or by a chemical vapor deposition (CVD) technique. Subsequently, heating is performed to react the metal with underlying silicon to form a metal silicide layer on the source/drain regions and gate electrodes. The metal silicide has a substantially lower sheet resistance than the silicon to which it is bonded. Desirably, the metal silicide is only formed on the underlying silicon, not on the dielectric sidewall spacers. Selective etching is then conducted to remove unreacted metal from the non-silicided areas, such as the dielectric sidewall spacers. Thus, the silicide regions are aligned only on the electrically conductive areas. This self-aligned silicide process is generally referred to as the "salicide" process.

A portion of a typical semiconductor device 10 is schematically illustrated in FIG. 1 and comprises a silicon-containing substrate 12 with shallow source/drain extensions 15A and source/drain 15B regions formed therein. Gate oxide 24 and gate electrode 28 are formed on the silicon-containing substrate 12. Sidewall spacers 18 are formed on opposing side surfaces 29 of gate electrode 28. Sidewall spacers 18 typically comprise silicon based insulators, such as silicon nitride, silicon oxide, or silicon carbide. The sidewall spacers 18 function to mask shallow source/drain extensions 15A during ion implantation to form source/drain regions 15B. The sidewall spacers 18 also mask the side surfaces 29 of the gate 28 when metal layer 16 is deposited, thereby preventing silicide from forming on the side surfaces 29.

After metal layer 16 is deposited, heating is conducted at a temperature sufficient to react the metal with underlying silicon in the gate electrode and substrate surface to form conductive metal silicide contacts 26. After the metal silicide contacts 26 are formed, the unreacted metal 16 is removed by etching, as with a wet etchant, e.g., an aqueous $H_2O_2/NH_4OH$ solution. The sidewall spacer 18, therefore, acts as an electrical insulator separating the silicide contact 26 on the gate electrode 28 from the metal silicide contacts 26 on the source/drain regions 15B, as shown in FIG. 2.

Difficulties are encountered in such a conventional silicidation process, particularly when employing silicon nitride sidewall spacers and nickel as the metal. Specifically it was found that nickel reacts with dangling silicon bonds in the silicon nitride sidewall spacers during heating to form nickel silicide layers on the sidewall spacer surface 20 forming an electrical bridge between the nickel silicide contact 26 on the gate electrode 28 and the nickel silicide contact 26 on the source/drain regions 15B. This undesirable effect is particularly problematic as device design rules plunge into the deep sub-micron range and is schematically illustrated in FIG. 3, wherein sidewall spacer surface 20 contains dangling silicon bonds 21. When the metal layer 16 is deposited on the sidewall spacer surface 20 and heated, a metal silicide layer 26 remains on the surface of the sidewall spacer 20 after etching.

Bridging between the gate electrode and the associated source/drain regions results in diminished device performance and device failure.

Additional difficulties encountered in the silicidation process include oxidation of the gate electrode and source/drain surfaces. Surface oxides on the gate electrode and source/drain regions can inhibit the silicidation reaction between the metal and silicon. Metals that can not diffuse through a silicon oxide surface film, such as titanium, will not readily react with the underlying silicon when heated, resulting in inadequate metal silicide formation. Surface oxides readily form on exposed silicon surfaces under ambient environmental conditions. Aqueous HF is conventionally used to remove surface oxides prior to depositing the silicidation metal. However, if the metal layer is not deposited in a timely manner after HF treatment, the surface oxide layer will be regenerated, requiring additional HF treatment. In addition, the use of aqueous HF to remove surface oxide films from the gate and source and drain regions also undesirably removes surface Oxides and leaves dangling silicon bonds on the sidewall spacers.

The term semiconductor devices, as used herein, is not to be limited to the specifically disclosed embodiments. Semiconductor devices, as used herein, include a wide variety of electronic devices including flip chip, flip chip/package assemblies, transistors, capacitors, microprocessors,random access memories, etc. In general, se comprising semiconductors.

SUMMARY OF THE INVENTION

There exists a need for efficient methodology to produce highly reliable semiconductor devices with ultra-shallow junctions by eliminating bridging between transistor gate electrodes and associated source/drain regions and preventing surface oxidation of gate electrodes and source/drain regions. There exists a particular need in this art to eliminate nickel silicide formation on silicon nitride sidewall spacer surfaces.

These and other needs are met by the embodiments of the present invention, which provide a method of passivating a semiconductor device comprising: providing an intermediate product comprising a gate electrode on a semiconductor substrate with a gate insulating layer therebetween. The gate electrode has an upper surface and opposing side surfaces. The intermediate product is contacted with a solution comprising iodine and ethanol for a period of time sufficient to passivate surface regions of the intermediate product.

The earlier stated needs are also met by another embodiment of the instant invention which provides a method of manufacturing a semiconductor device comprising forming silicide contacts on a semiconductor device comprising: providing an intermediate product comprising a gate electrode and source/drain regions, wherein sidewall spacers are formed on the side surfaces of the gate electrode. The surfaces of the intermediate product are contacted with an iodine and ethanol solution for a period of time sufficient to passivate the surfaces of the intermediate product. A metal layer is deposited over the intermediate product and the metal layer is subsequently heated at a temperature sufficient to cause the metal to react with silicon in the gate electrode and source/drain regions to form metal silicide. Unreacted metal is subsequently removed from the intermediate product.

The earlier stated needs are further met by another embodiment of the instant invention that provides a semiconductor device comprising a gate electrode on a semiconductor substrate with a gate insulating layer therebetween. The gate electrode has an upper surface and opposing side surfaces. The surfaces of the semiconductor device are passivated by contacting them with an iodine and ethanol solution.

The foregoing other features, aspects, and advantages of the present invention will become apparent in the following detailed description of the present invention when taken in conjunction with, the accompanying drawings.

DETAILED DESCRIPTION OF THE INVENTION

The present invention enables the production of semiconductor devices with improved performance and reduced failure rates by preventing electrical bridging between a transistor gate electrode and associated source/drain regions and by preventing surface oxidation of the gate electrode and source and drain regions. These objectives are achieved by strategically passivating the surfaces of a semiconductor device intermediate product to limit metal silicide formation to the upper surfaces of the gate electrode and substrate during the silicidation process.

Figure 1:
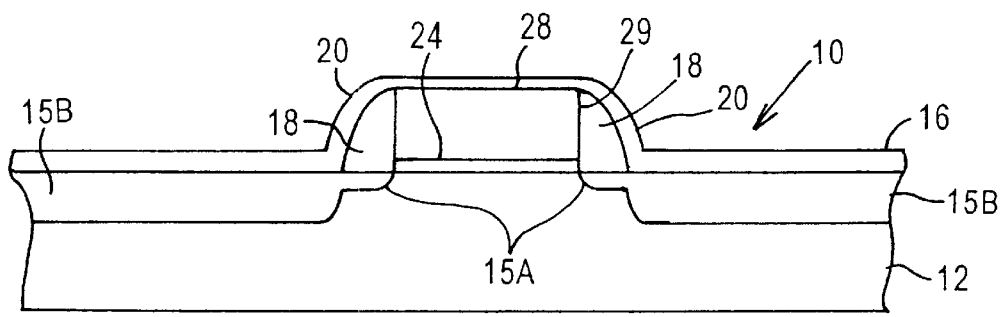
FIG. 1 schematically illustrates a gate/source/drain region of a semiconductor device formed by a conventional method.
Figure 2:
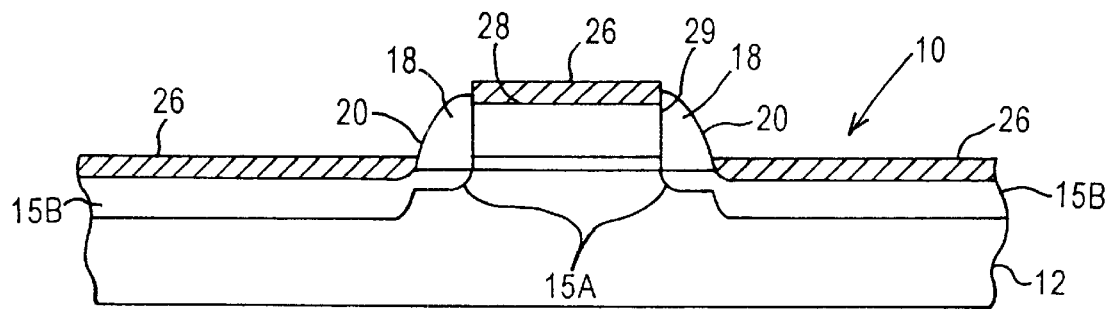
FIG. 2 schematically illustrates a gate/source/drain region of a semiconductor device formed by a conventional salicide method.
Figure 3:
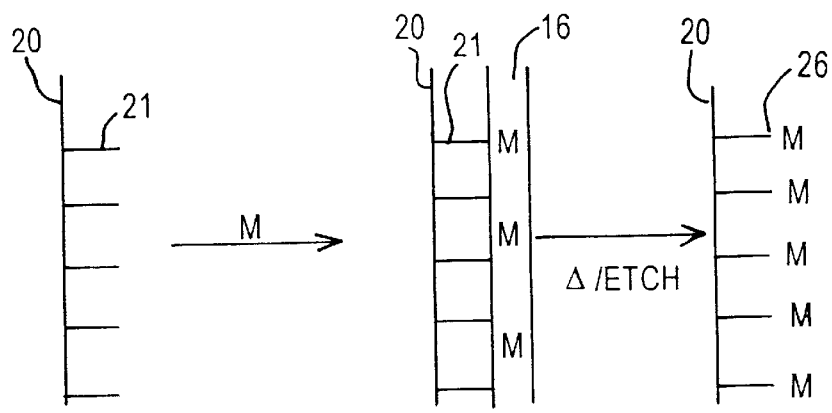
FIG. 3 schematically illustrates the formation of metal silicide on sidewall spacers.

As shown in FIG. 3, dangling silicon bonds 21 on the sidewall spacer surface 20 react with deposited metal layer 16 to form a metal silicide layer 26 on the sidewall spacer surface 20. The present invention enables the prevention of metal silicide layer 26 on sidewall spacer surface 20 by passivating the sidewall spacer surface prior to depositing metal layer 16. Such passivation substantially eliminates the dangling silicon bonds making them unavailable to react with the deposited metal.

Dangling silicon bonds can be passivated by reaction with oxygen to form an oxide that does not react with metal layer 16 during the heating process, thereby preventing conductive metal silicide from forming on the sidewall spacers. The passivated sidewall spacers then satisfy their intended function as insulators between the gate electrode and the source/drain regions.

Several techniques can be used to passivate the dangling silicon bonds with oxygen. For example, the intermediate product can be exposed to a microwave oxygen plasma. The oxygen plasma provides highly reactive oxygen ions that react with the dangling silicon bonds to form stable silicon oxides. Another technique of passivation involves contacting the semiconductor device with a solution of hydrogen peroxide and sulfuric acid. The use of oxygen plasma to passivate the spacers requires an expensive oxygen plasma generating apparatus. While the use of a hydrogen peroxide and sulfuric acid solution requires handling and subsequent disposal of highly corrosive chemicals. Furthermore, oxygen passivation techniques also form an oxide film, on the gate electrode and source/drain regions, that can interfere with subsequent silicidation.

The present invention provides an elegant, economical method of passivatiig semiconductor devices. The present invention effects semiconductor device surface passivation using an iodine ($I_2$) and ethanol solution to introduce hydroxyl (OH) groups into the dangling silicon bonds.

Figure 4:
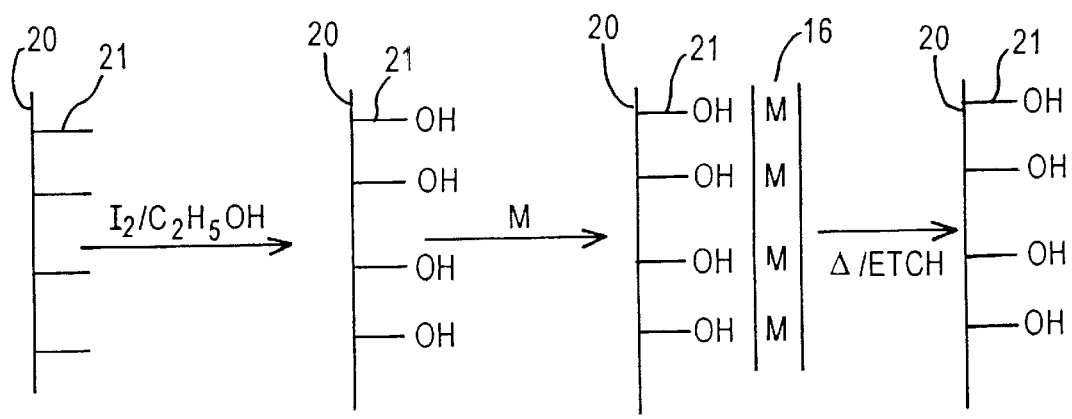
FIG. 4 schematically illustrates sidewall spacer passivation according to an embodiment of the present invention.

An embodiment of the present invention is schematically illustrated in FIG. 4. A sidewall spacer surface 20 with dangling silicon bonds 21 is contacted with a solution of iodine and ethanol for a period of time sufficient to passivate the sidewall spacer surface. Passivation is effected by contacting the dangling silicon bonds 21 with the $I_2$/ethanol solution to generate hydroxyl groups that react with the dangling silicon bonds 21. The passivation step leaves-the sidewall spacer surface 20 substantially free of dangling silicon bonds 21 which would otherwise react with the subsequently deposited metal, e.g., nickel, during silicidation After passivation, metal layer 16 is deposited over the intermediate product 10, including the sidewall spacer surface 20. The metal does not react with the passivated sidewall surface during subsequent heating. As a result, the unreacted metal is easily removed during etching, leaving the sidewall spacer surface 20 substantially free of metal silicide.

Silicon bonds on the surface of the gate electrode and source/drain regions will also react with the $I_2$/ethanol solution to form a thin hydroxide layer on their respective surfaces. However, the hydroxide layer formed on the surfaces of the gate electrode and source/drain regions does not prevent subsequent silicide formation thereon because these regions are predominantly elemental silicon available for reaction with the metal layer. The sidewall spacers, on the other hand, are predominantly relatively inert silicon compounds, where only dangling silicon bonds are available for reaction with the metal layer. While a portion of the silicon on the surface of the gate electrode and source/drain regions forms a thin hydroxide layer when exposed to the $I_2$/ethanol solution, there is abundant silicon remaining to form the metal silicide contacts.

The concentration of $I_2$ in the $I_2$/ethanol solution ranges from about 0.01 moles/liter to about 20.0 moles/liter. In certain embodiments of the present invention, a concentration of iodine in the solution of about 2.0 moles/liter to about 20.0 moles/liter efficiently passivates the surfaces of the semiconductor devices.

The solution is contacted with the surfaces of the semiconductor device for a period of time sufficient to passivate the sidewall spacer surfaces, gate electrode upper surface, and substrate upper surface. The length of time to effect passivation can be determined for a particular situation and ranges from about 1 minute to about 60 minutes. In certain embodiments, for example in passivating silicon nitride sidewall spacers, an exposure time of about 5 minutes to about 35 minutes, e.g. about 10 minutes, is sufficient to prevent nickel silicide thereon.

Figure 5:
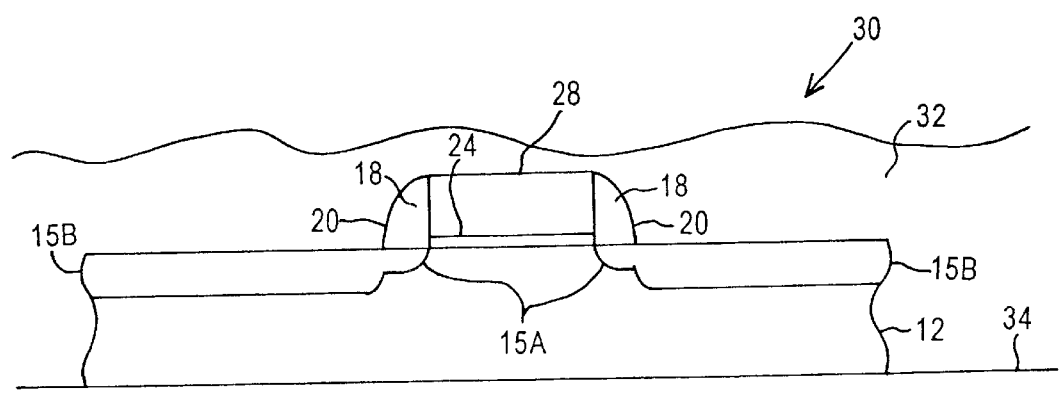
FIG. 5 illustrates the passivation of sidewall spacers of a semiconductor device by immersing the semiconductor device in an iodine/ethanol solution.

The semiconductor device can be contacted with the $I_2$/ethanol solution by immersing the intermediate product 10 in a vessel 34 containing the $I_2$/ethanol solution 32, as illustrated in FIG. 5.

Figure 6:
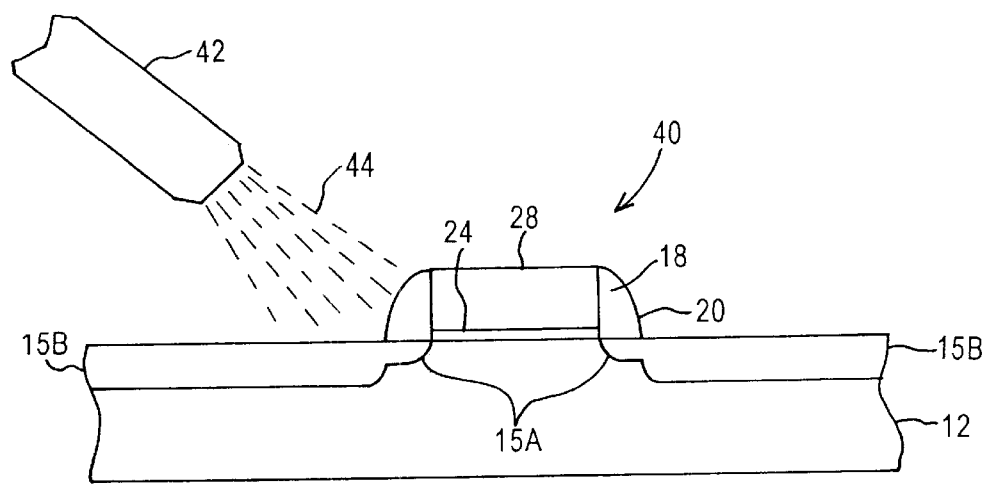
FIG. 6 illustrates the passivation of sidewall spacers of a semiconductor device by spraying the device with an iodine/ethanol solution.

Alternatively, the $I_2$/ethanol solution 44 can be sprayed onto the surface of the intermediate product 10 by a spray nozzle 42, as shown in FIG. 6.

The temperature of the $I_2$/ethanol solution employed for passivation in accordance with embodiments of the present invention can range from about 1° C. to about 80° C. When passivating silicon nitride sidewall spacers, for example, the solution is advantageously applied between about 5° C. and 35° C., or more advantageously between about 17° C. and 27° C., which provides the convenience of room temperature processing.

The metal layer 16 comprises a metal that forms a metal silicide with high conductivity.

Typical silicidation metals include Co, Ni, Ti, W, Ta, Mo, Cr, Pt, and Pd. In certain embodiments Co, Ni, and Ti have been found to provide high reliability, high conductivity silicide contacts. Nickel has been found to particularly advantageous because it enables low temperature salicide processing.

Metal layer 16 is deposited by a PVD method, such as sputtering or evaporation, or a CVD method. The metal layer is deposited to a thickness of about 100 Å to about 500 Å. The metal is heated at a temperature ranging from about 300° C. to about 1000° C. depending on the metal deposited. For example, if Co is deposited, the Co is heated for about 10 seconds to 60 seconds at about 600° C. to about 850° C. to form $CoSi_2$. When Ni is the metal layer deposited, the metal layer is heated for about 15seconds to about 120 seconds at 350° C. to about 700° C., to form NiSi.

The method of the present invention prevents metal silicide bridging across sidewall spacers. The invention prevents device failure due to electrical bridging between the gate electrode and the source/drain regions. By reacting dangling silicon bonds with a solution of iodine and ethanol to form hydroxyl groups at the dangling silicon bonds, deposited metal does not react with the dangling silicon bonds to form conductive suicides. The present invention provides sidewall spacer surfaces that are substantially free of dangling silicon bonds and metal silicide. This invention further prevents surface oxide formation on the gate electrode and source/drain regions, which enables the formation of improved silicide contacts. This invention increases the yield of semiconductor fabrication processes in novel and elegant manner.

The embodiments illustrated in the instant disclosure are for illustrative purposes only. The embodiments illustrated should not be construed to limit the scope of the claims. As is clear to one of ordinary skill in the art, the instant disclosure encompasses a wide variety of embodiments not specifically illustrated herein.

What is claimed is:

1. A method of manufacturing a semiconductor device, the method comprising:

providing an intermediate product comprising: a silicon-containing gate electrode on a silicon-containing semiconductor substrate with a gate insulating layer therebetween, the silicon-containing gate electrode having an upper surface and opposing side surfaces; and contacting the intermediate product with a solution comprising iodine and ethanol for a period of time sufficient to passivate surface regions of the intermediate product.

2. The method according to claim 1, wherein sidewall spacers are formed on the opposing side surfaces prior to contacting the intermediate product with the solution.

3. The method according to claim 2, wherein the sidewall spacers comprise silicon nitride.

4. The method according to claim 3, wherein the concentration of iodine in the solution is from about 0.01 moles/liter to about 20.0 moles/liter.

5. The method according to claim 4, wherein the concentration of iodine in the solution is from about 2.0 moles/liter to about 20.0 moles/liter.

6. The method according to claim 3, comprising contacting the intermediate product by immersing the intermediate product in the solution.

7. The method according to claim 3, comprising contacting the intermediate product by spraying the solution onto the intermediate product.

8. The method according to claim 3, comprising contacting the intermediate product with the solution for about 1 minute to about 60 minutes.

9. The method according to claim 3, wherein the solution is applied to the substrate at a temperature of about 1° C. to about 40° C.

10. The method according to claim 3, further comprising forming source/drain regions adjacent to the sidewall spacers.

11. The method according to claim 10, further comprising forming silicide contacts on a semiconductor device comprising:

depositing a metal layer on the upper surface of the silicon-containing gate electrode, sidewall spacers, and source/drain regions;

heating to react the metal with silicon in the silicon-containing gate electrode and the silicon-containing semiconductor substrate to form a metal silicide layer on the gate electrode and metal silicide layers on the source/drain regions; and removing unreacted metal from the sidewall spacers.

12. The method according to claim 11, wherein the metal is selected from the group consisting of Co, Ni, Ti, Ta, Mo, W, Cr, Pt, and Pd.

13. The method according to claim 12, wherein the metal is Ni.

* * * * *